(12) United States Patent
Ando et al.

(10) Patent No.: US 7,907,383 B2
(45) Date of Patent: *Mar. 15, 2011

(54) ELECTROSTATIC CHUCK

(75) Inventors: Masami Ando, Fukuoka (JP); Jun Miyaji, Fukuoka (JP); Osamu Okamoto, Fukuoka (JP)

(73) Assignee: Toto Ltd., Fukuoka (JP)

( * ) Notice: Subject to any disclaimer, the term of this patent is extended or adjusted under 35 U.S.C. 154(b) by 395 days.

This patent is subject to a terminal disclaimer.

(21) Appl. No.: 12/086,967

(22) PCT Filed: Feb. 8, 2007

(86) PCT No.: PCT/JP2007/052175
§ 371 (c)(1),
(2), (4) Date: Jun. 23, 2008

(87) PCT Pub. No.: WO2007/091619
PCT Pub. Date: Aug. 16, 2007

(65) Prior Publication Data
US 2009/0273877 A1 Nov. 5, 2009

Related U.S. Application Data

(63) Continuation-in-part of application No. 11/879,204, filed on Jul. 16, 2007, now Pat. No. 7,450,365, which is a continuation of application No. 11/272,788, filed on Nov. 15, 2005, now Pat. No. 7,248,457.

(30) Foreign Application Priority Data

Feb. 8, 2006 (JP) ................................ 2006-031545

(51) Int. Cl.
*H01T 23/00* (2006.01)
*C04B 35/00* (2006.01)
(52) U.S. Cl. ...................... 361/234; 501/153; 501/127
(58) Field of Classification Search .................. 361/234; 501/153, 127
See application file for complete search history.

(56) References Cited

U.S. PATENT DOCUMENTS

2002/0190512 A1   12/2002   Abe

FOREIGN PATENT DOCUMENTS

| JP | 62-094953 | 5/1987 |
| JP | 3204924 | 9/1991 |
| JP | 05-211228 | 8/1993 |
| JP | 06-97675 | 11/1994 |
| JP | 08-081258 | 3/1996 |
| JP | 9330974 | 12/1997 |

(Continued)

*Primary Examiner* — Jared Fureman
*Assistant Examiner* — Lucy Thomas
(74) *Attorney, Agent, or Firm* — Carrier Blackman & Associates, P.C.; Joseph P. Carrier; William D. Blackman

(57) ABSTRACT

The present invention provides an electrostatic chuck in which the surface can be kept smooth after being exposed to plasma, so as to protect a material to be clamped such as a silicon wafer from being contaminated with particles, and which is excellent in clamping and releasing a material to be clamped and easy to manufacture by low-temperature firing. The electrostatic chuck includes a dielectric material in which alumina is 99.4 wt % or more, and titanium oxide is more than 0.2 wt % and equal to or less than 0.6 wt %, wherein the electrostatic chuck's volume resistivity is $10^8$-$10^{11}$ Ωcm in room temperature, and wherein the titanium oxide segregates in boundaries of particles of the alumina.

18 Claims, 3 Drawing Sheets

FOREIGN PATENT DOCUMENTS

| | | |
|---|---|---|
| JP | 10-279349 | 10/1998 |
| JP | 11-312729 | 11/1999 |
| JP | 3084869 U | 7/2000 |
| JP | 2000-243820 | 9/2000 |
| JP | 2002-190512 A | 7/2002 |
| JP | 2002-203893 | 7/2002 |
| JP | 2004-018296 | 1/2004 |
| JP | 2004-352572 | 12/2004 |
| JP | 2005-033125 | 2/2005 |
| JP | 2006-165107 | 6/2006 |

ELECTROSTATIC CHUCK

CROSS-REFERENCE TO RELATED APPLICATIONS

The present application is a U.S. National phase of, and claims priority based on PCT/JP2007/052175, filed 08 Feb. 2007, which, in turn, claims priority from Japanese patent application 2006-031545, filed 08 Feb. 2006. The entire disclosure of each of the referenced priority documents is incorporated herein by reference. Also the present application is a continuation-in-part of application 11/879,204, filed 16 Jul. 2007 (now U.S. Pat. No. 7,450,365), which is a continuation of application 11/272,788, filed 15 Nov. 2005 (now U.S. Pat. No. 7,248,457).

BACKGROUND OF THE INVENTION

1. Field of the Invention

The present invention relates to an electrostatic chuck for clamping and fixing a material to be clamped such as a semiconductor wafer or a glass substrate for an FPD with electrostatic force.

2. Description of the Related Art

Conventionally, a ceramic dielectric material of an electrostatic chuck is provided for the purpose of controlling the electrical characteristics (See Document 1).

However, if the ceramic structure is exposed to a plasma atmosphere, the structure is subject to corrosion, and the surface roughness is deteriorated. Consequently, there are some cases where variations in the contact state between the surface of the electrostatic chuck and the wafer occur over time, or there are other cases where grains are disjoined from a sintered body and the disjoined grain particles cause the wiring of an LSI circuit to be shorted.

In another conventional example, an alumina ceramic material having a particle diameter of 2 μm or less and a relative density of 99.9% in which the plasma-resistance is improved is applied to an electrostatic chuck (See Document 2). However, in this example, even if the plasma-resistance is improved, there is no description of the electrical characteristics, and it is impossible to perform fundamental functions of a Johnsen-Rahbeck electrostatic chuck which enables great clamping force.

Also, an alumina ceramic which contains titanium oxide of 0.1-1 wt % and has volume resistivity of $10^0$-$10^4$ Ωcm has been proposed (See Document 3). However, in this case, it is impossible to obtain electrical characteristics for performing functions of an electrostatic chuck.

Also, an electrostatic chuck in which the volume resistivity is reduced by adding titanium oxide of 0.5-2 wt % to an alumina ceramic has been proposed (See Document 4). This document has disclosed that the resistivity is not reduced in a case of less than 0.5 wt %, and too much current flows in a case of 2.0 wt % or more. It has also disclosed that titanium oxide is segregated in the grain boundary of alumina ceramics. Although an additive of at least 0.5 wt % is required to reduce the volume resistivity, such an amount of the additive is too much for an electrostatic chuck which requires a strict limitation in contamination with respect to a material to be clamped.

Also, there has been proposed an electrostatic chuck in which alumina of 99% or more is contained, the average particle diameter is 1-3 μm, and the volume resistivity is $10^8$-$10^{11}$ Ωcm in a temperature of 300-500° C. (See Document 5). However, there is no description of properties of a dielectric material required for an electrostatic chuck which is used in another temperature range, for example, a relatively low temperature such as 100° C. or less.

Document 1: Japanese Patent No. 3084869
Document 2: Japanese Patent Application Publication No. 10-279349
Document 3: Japanese Patent Application Publication No. 2004-18296
Document 4: Japanese Pre-grant Publication No. 6-97675
Document 5: Japanese Patent Application Publication No. 11-312729

The object of the present invention is to provide an electrostatic chuck in which the surface can be kept smooth after being exposed to plasma, so as to protect a material to be clamped such as a silicon wafer from being contaminated with particles, and which is excellent in clamping and releasing a material to be clamped and easy to manufacture by low-temperature firing.

SUMMARY OF THE INVENTION

In order to achieve the above-mentioned object, according to the present invention, there is provided an electrostatic chuck including a dielectric material in which alumina is 99.4 wt % or more, titanium oxide is more than 0.2 wt % and equal to or less than 0.6 wt %, and whose volume resistivity is $10^8$-$10^{11}$ Ωcm in a room temperature, wherein titanium oxide segregates in the boundary of alumina particles. With this, it is possible to improve the plasma resistance of the electrostatic chuck dielectric material and achieve fundamental functions of the electrostatic chuck at the same time, and it is also possible to manufacture the electrostatic chuck at low cost.

The reason why the volume resistivity needs to be $10^8$-$10^{11}$ Ωcm is for using Johnsen-Rahbeck effects as clamping force of the electrostatic chuck. It is possible to generate very great clamping force by using Johnsen-Rahbeck effects. Consequently, it is possible to reduce the contact area with a material to be clamped so as to be 1-10% with respect to the area of the clamping surface by providing protrusions on the surface of the electrostatic chuck.

Further, by adjusting the height of the protrusions provided on the surface to be 5-15 μm, it is possible to exert clamping force even in non-contact portions. As a result of this, the area of the protrusions can be 0.001% or more and less than 0.5% with respect to the area of the clamping surface. As for the temperature of the material to be clamped, heat transfer is performed via the contact portions. Consequently, even if the structure of the protrusions is subject to corrosion caused by the plasma, such effect can be reduced as the contact area of the protrusions decreases. Therefore, it is possible to achieve an electrostatic chuck in which little variations occur over time by improving the plasma-resistance and reducing the contact area with the material to be clamped.

In order to improve the response properties of the clamping force, it is necessary to decrease the value of the following equation:

$$ts = 1.731 \times 10^{-11} \times \rho (\in r + d/h) \text{ (sec.)}$$

where ts is time (sec.) required for decreasing the clamping force to be 2% with respect to the initial clamping force of 100%, ρ is volume resistivity of the dielectric layer (Ωm), ∈r is the relative dielectric constant of the dielectric layer, d is the thickness of the dielectric layer (m), and h is the height of the protrusions (m). When the value of this equation is 0.001-0.6 and the height of the protrusions is 5-15 μm, the area of the protrusions can be 0.001-0.5% with respect to the clamping surface. At the same time, it is possible to achieve an electrostatic chuck having good response of clamping force with respect to applying or removing voltage.

The above-mentioned equation is obtained by making an analytical calculation based on the equivalent circuit shown in FIG. 1 and deriving Equations 1-4. In these equations, $q_1$ is the charge density, S is the electrode area, C is the capacitance, G is the conductance, V is the applied voltage, t is time (variable), and T is time for applying voltage.

$$f = \frac{q_1^2}{2\varepsilon_0}\left(q_1 = \frac{Q_1}{S}\right) 0 \leq t \leq T \qquad \text{Equation 1}$$

$$q_1(t) = q_c(t) + q_i(t) \qquad (1)$$

$$q_c = C_1 \frac{C_2}{C_1 + C_2} V \cdot \exp\left(-\frac{G_2}{C_1 + C_2}t\right) \qquad (2)$$

$$q_j = C_1 \frac{G_2}{G_1 + G_2} V \cdot \left\{1 - \exp\left(-\frac{G_2}{C_1 + C_2}t\right)\right\} t > T \qquad (3)$$

$$q_1(t) = q_c(t) + q_j(t) - \{q_c(t - T) + q_j(t - T)\} \qquad (4)$$

$$\tau = \frac{2(C_1 + C_2)}{G_2} \qquad \text{Equation 2}$$

$$C_1 = \varepsilon_0 \frac{S}{d} \qquad \text{Equation 3}$$

$$C_2 = \varepsilon_0 \varepsilon_r \frac{S}{h}$$

$$G_2 = \frac{1}{R_2} = \frac{S}{\rho d}$$

$$t > T \qquad \text{Equation 4}$$

$$q_1 = C_1 \frac{C_1}{C_1 + C_2} V \cdot \exp\left(-\frac{G_2}{C_1 + C_2}(t - T)\right)$$

According to another aspect of the present invention, there is provided an electrostatic chuck including a dielectric material in which alumina is 99.4 wt % or more, titanium oxide is more than 0.2 wt % and equal to or less than 0.6 wt %, whose bulk density is 3.97 g/cm$^3$ or more, and whose volume resistivity is $10^8$-$10^{11}$ Ωcm in room temperature, wherein titanium oxide segregates in the boundary of alumina particles. With this, the porosity of the structure of the electrostatic chuck is small, and improvement of the plasma resistance and fundamental functions of the electrostatic chuck can be achieved at the same time, and it is also possible to manufacture the electrostatic chuck at low cost.

In a preferred embodiment of the present invention, the electrostatic chuck is used in a low temperature of 100° C. or less.

In the above-mentioned electrostatic chuck, the dielectric material having a smooth surface includes a plurality of protrusions on which a material to be clamped is mounted, in which the ratio between the total area of the top surfaces of the protrusions and the area of the surface of the dielectric material is equal to or more than 0.001% and less than 0.5%, and the height of the protrusions is 5-15 μm. With this, it is possible to minimize the effect of variation in the clamping state caused by damage of the surface of the contact area with the material to be clamped due to corrosion by plasma. However, if the ratio of the contact area is less than 0.001%, the size of each protrusion will be too small and the processing will be difficult. If the ratio of the contact area exceeds 1%, it becomes impossible to disregard the effect of plasma corrosion to the surface of the protrusions in contact with the material to be clamped.

DETAILED DESCRIPTION OF PREFERRED EMBODIMENTS

Figure 1:
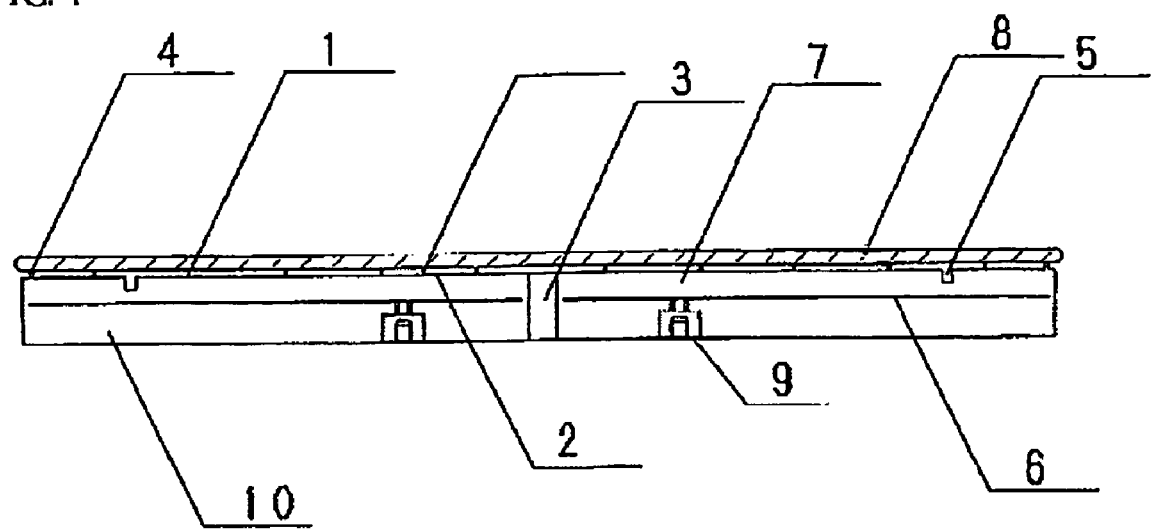
FIG. 1 shows an electrostatic chuck according to an exemplary embodiment of the present invention.
Figure 2:
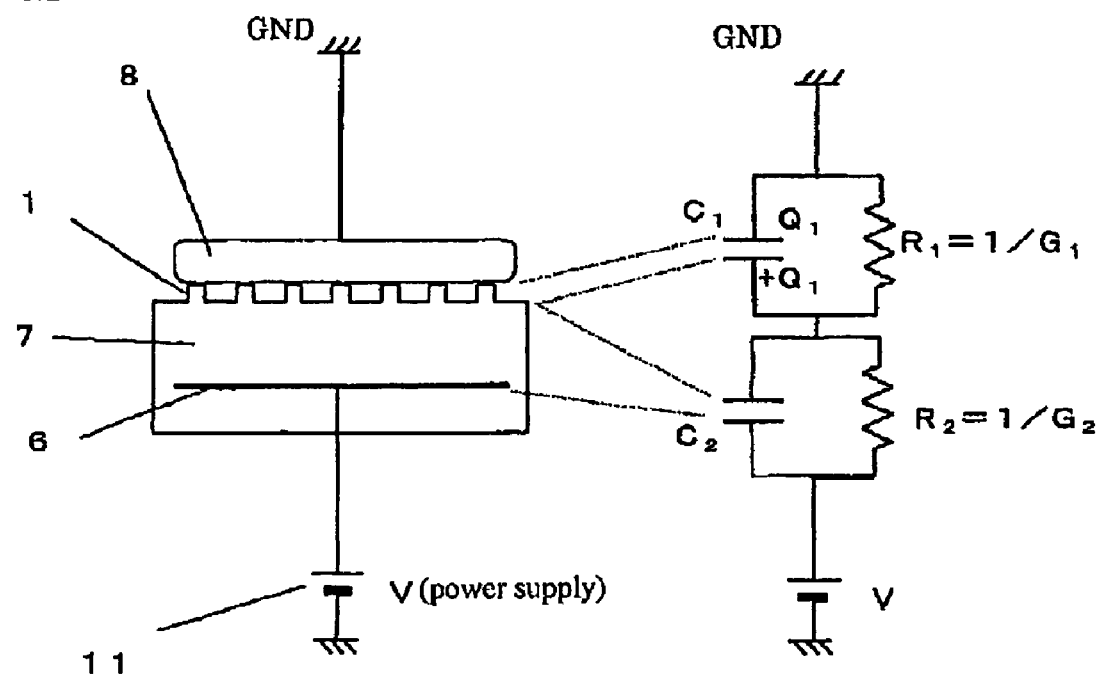
FIG. 2 shows an equivalent circuit of the electrostatic chuck according to the exemplary embodiment of the present invention.
Figure 3:
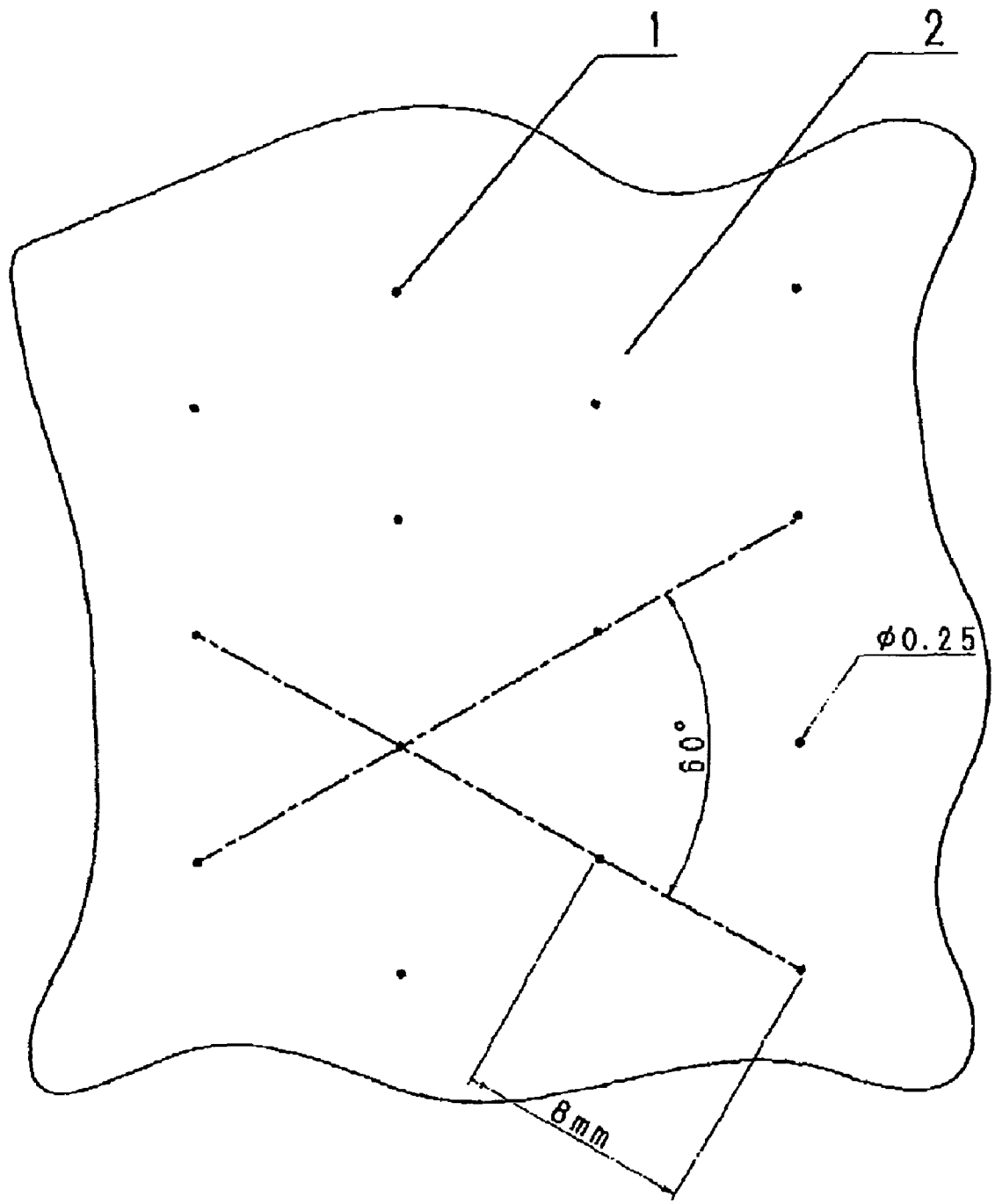
FIG. 3 is an enlarged view of the surface pattern of the electrostatic chuck according to the exemplary embodiment of the present invention.

Alumina, titanium oxide, and transition metal oxide as ingredients were granulated at a mixing ratio shown in Table 1. The average particle diameter of the alumina was 0.1 μm, and the purity of the alumina was 99.99% or more. The purity of the titanium oxide was 98% or more.

Slurry Preparation, Granulation, and Raw Processing

The above ingredients were mixed at the mixing ratio shown in Table 1, and crushed. After an acrylic binder was added and adjusted, granulation by spray-drying was performed to prepare granulated powder. After the granulated powder was filled in a rubber mold, CIP (pressure: 1 ton/cm$^2$) was performed, and an ingot was formed. The ingot was processed to have a predetermined shape, and a raw formed body was obtained. Ion-exchange water or the like was used for mixing, so that contaminants could be prevented from entering as much as possible.

Firing

The above raw formed body was fired in an atmosphere of nitrogen and hydrogen gas. The firing temperature was 1150-1350° C., and the firing time was 1-8 hours. That is, conditions for achieving the highest bulk density were selected. In this instance, humidifying gas was used so as to degrease. By performing reduction firing, it is possible to achieve non-stoichiometric composition of titanium oxide and adjustment of the volume resistivity.

HIP Processing

Further, HIP processing was performed. The conditions for HIP were Ar gas of 1500 atm. and a temperature identical to the firing temperature or less than the firing temperature by 30° C.

Measurements of Properties

After the HIP processing, measurements of the bulk density, the average particle diameter by observing of the structure of the fired body with an SEM, the volume resistivity, the friction force in vacuum, and the remaining time were performed. For the measurements of the friction force and the remaining time, the thickness of the ceramic dielectric layer was 1 mm. Voltage of 200 V was applied as clamping voltage. For the measurement of the remaining time, the power supply was turned off after voltage was applied for 1 minute, and the damping of the remaining friction force was measured. The material to be clamped was a mirror surface of a silicon wafer. The remaining time was a period of time from turning the power supply off to damping the friction force to 2%.

Also, plasma irradiation was actually performed, and variation in the surface roughness (centerline average roughness Ra) of the ceramics was measured. The surface roughness Ra was 0.05 μm or less in the initial state. Plasma was discharged for 5 hours at 1000 W in a reactive ion etching apparatus with $CF_4+O_2$ as etching gas.

Further, in order to evaluate actual clamping force of the electrostatic chuck, pressure of He gas was applied between some of the samples and the material to be clamped so as to measure the pressure where the material to be clamped is released (POPOFF clamping force). The clamping voltage was 1000 V.

Comparative Products

Examples of alumina ceramics according to the conventional method were prepared for comparison. The composition of comparative product 1 was alumina of 98 wt % having an average particle diameter of 5 μm and titanium oxide of 2 wt %. The composition of comparative product 2 was alumina of 99 wt % and titanium oxide of 1 wt %, and the firing temperature was 1580° C. The surface roughness of comparative product 1 was Ra 0.23 μm in the initial state. The surface roughness of comparative product 2 was Ra 0.2 μm in the initial state. No HIP processing was performed to comparative products 1 and 2.

The results of the above-mentioned tests are shown in Tables 1 and 2. It turned out that volume resistivity enough to function as an electrostatic chuck can be obtained in an addition amount of titanium oxide which is more than 0.2 wt % and equal to and less than 0.6 wt % and bulk density of 3.97 g/cm³ by controlling the firing temperature. Specifically, the same effect can be obtained in an extremely small addition amount compared to a conventional case where the particle diameter is 50 μm or more. In a conventional manufacturing method, since the firing temperature is as high as 1580° C., the added titanium oxide is reacted with alumina so as to turn into a compound such as aluminum titanate ($Al_2TiO_5$). In contrast, according to the present invention, since the firing temperature is as low as 1300° C. or less by using fine alumina particles as a raw material having an average particle diameter of less than 0.2 μm and high purity of 99.9% or more, the added titanium oxide is not reacted with alumina so as to exist as titanium oxide, which has been confirmed by X-ray diffraction. It is known that the volume average particle diameter of 2 μm or less in a state where the titanium oxide is continuously connected with each other. It is assumed that the network of the titanium oxide can effectively reduce the volume resistivity. As described above, the volume resistivity can be reduced with a small addition amount of titanium oxide in the dielectric material for the electrostatic chuck according to the present invention compared to a conventional one because the added titanium oxide is not reacted with alumina so as to exist as titanium oxide and the titanium oxide segregates in the boundary of alumina particles in a state where the titanium oxide is continuously connected with each other. Also, since the titanium oxide has non-stoichiometric composition by reduction firing, the electric conductivity is further improved. As described above, the volume resistivity can be controlled with a small amount of titanium oxide and chemical contamination to a silicon wafer or the like can be controlled significantly compared to the conventional art.

TABLE 1

| No. | Alumina | Titanium oxide | Firing temperature ° C. | Bulk density of fired body g/cm³ |
|---|---|---|---|---|
| 1 | 100 wt % | 0 wt % | 1240 | 3.79 |
| 2 | 100 wt % | 0 wt % | 1270 | 3.88 |
| 3 | 99.9 wt % | 0.1 wt % | 1300 | 3.78 |
| 4 | 99.9 wt % | 0.1 wt % | 1240 | 3.89 |
| 5 | 99.8 wt % | 0.2 wt % | 1210 | 3.74 |
| 6 | 99.8 wt % | 0.2 wt % | 1240 | 3.89 |
| 7 | 99.7 wt % | 0.3 wt % | 1180 | 3.23 |
| 8 | 99.7 wt % | 0.3 wt % | 1210 | 3.91 |
| 9 | 99.6 wt % | 0.4 wt % | 1180 | 3.60 |
| 10 | 99.6 wt % | 0.4 wt % | 1210 | 3.92 |
| 11 | 99.5 wt % | 0.5 wt % | 1150 | 3.60 |
| 12 | 99.5 wt % | 0.5 wt % | 1180 | 3.92 |
| 13 | 99.4 wt % | 0.6 wt % | 1150 | 3.92 |
| 14 | 99.4 wt % | 0.6 wt % | 1180 | 3.92 |
| Comparative product 1 | 98 wt % | 2 wt % | 1580 | 3.75 |
| Comparative product 2 | 99 wt % | 1 wt % | 1580 | 3.7 |

TABLE 2

Figure 4:
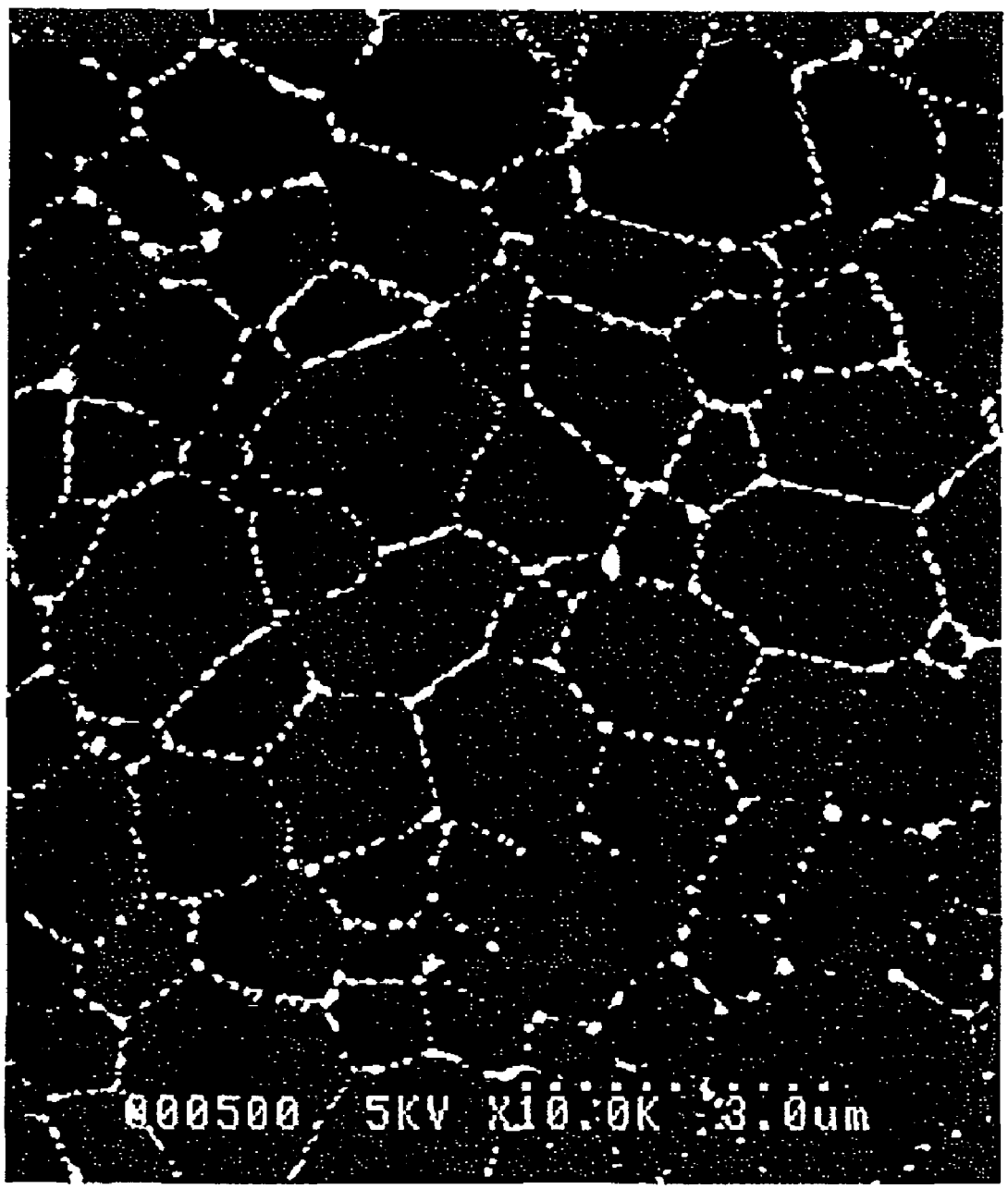
FIG. 4 is an electron microscope photograph showing a structure of a dielectric material of the electrostatic chuck according to the exemplary embodiment of the present invention.

| No. | Bulk density after HIP g/cm³ | Average particle diameter of fired body μm | Volume resistivity after HIP Ωcm | Friction force at voltage of 200 V gf/cm³ | Remaining time Min. | Surface roughness before plasma processing μm | Surface roughness after plasma processing μm |
|---|---|---|---|---|---|---|---|
| 2 | 3.98 | 0.9 | >10¹⁵ | >400 | >300 | 0.03 | 0.06 |
| 4 | 3.98 | 1.1 | 10¹⁵ | >400 | >300 | 0.03 | 0.06 |
| 6 | 3.98 | 1.3 | 10¹²·⁷ | >400 | 120 | 0.03 | 0.06 |
| 8 | 3.98 | 1.4 | 10¹⁰ | >400 | 8 | 0.03 | 0.06 |
| 10 | 3.98 | 1.5 | 10⁹·³ | >400 | 4 | 0.03 | 0.07 |
| 12 | 3.98 | 1.5 | 10⁸·⁵ | >400 | 1 | 0.03 | 0.07 |
| 14 | 3.97 | 1.7 | 10⁸·³ | >400 | 1 | 0.03 | 0.07 |
| Comparative product 1 | — | 80 | 10¹⁰·³ | >400 | 15 | 0.23 | 0.56 |
| Comparative product 2 | — | 70 | 10¹¹ | >400 | 30 | 0.2 | 0.6 | resistivity of alumina titanate is relatively high, and it is therefore assumed that a more addition amount of titanium oxide is needed in order to reduce the volume resistivity. Next, as a microstructure of the dielectric material for the electrostatic chuck according to the present invention, FIG. 4 shows an SEM photograph of a sample which has undergone thermal etching in a temperature around 80-150° C. lower than the firing temperature. It turned out that titanium oxide (white part of the photograph) segregates in the boundary of alumina particles (black part of the photograph) having an As a result of the electrical properties evaluation, it turned out that the volume resistivity can be controlled in the wide range of $10^8$-$10^{16}$ Ωcm depending on the addition amount of titanium oxide alone or titanium oxide and transition metal oxide.

In a case of using a resist, it is preferable to use the electrostatic chuck in a low temperature of 100° C. or less in terms of the heat resistance temperature of the resist.

Regarding the electrical properties required for a dielectric material for an electrostatic chuck, it is preferable that the volume resistivity is $10^8$-$10^{11}$ Ωcm in a temperature where the electrostatic chuck is used. If it is less than $10^8$ Ωcm which is the minimum, too much current flows into a wafer and the device might be damaged. If it is more than $10^{11}$ Ωcm which is the maximum, the response of wafer clamping and release to the applied voltage is deteriorated.

In processes such as an etching process of 100° C. or less, for example, the minimum value is preferably around $10^9$-$10^{11}$ Ωcm.

Also, if titanium oxide is more than 0.6 wt %, the volume resistivity becomes less than $10^8$ Ωcm, too much current flows into a wafer and the device might be damaged. If titanium oxide is 0.2 wt % or less, the effect of reducing the volume resistivity by adding titanium oxide might be reduced.

The plasma resistance was evaluated based on variation in the surface roughness because any material is etched if ion energy in plasma is excessive.

As for the ceramic dielectric material according to the present invention, variation in the surface roughness was significantly small compared to a conventional one. It is assumed that this is because the size of particles is small.

An electrostatic chuck comprising a dielectric material having a smooth surface was produced, in which a plurality of protrusions on which a material to be clamped is mounted were formed and the volume resistivity was $10^{9.3}$ Ωcm, and in which the ratio between the total area of the top surfaces of the protrusions and the area of the surface of the dielectric material was 0.089%. In this instance, the protrusions having a diameter of ϕ0.25 were formed in each vertex of equilateral triangles having a side of 8 mm continuously which were adjacent to each other. The height of the protrusions was 10 μm.

Accordingly, it was possible to extremely reduce the temperature variation which occurs over time at the time of processing a silicon wafer as a material to be clamped due to both of small variation of the surface roughness after the plasma irradiation and the very small contact area with the material to be clamped.

The POPOFF clamping force was 100 torr or more with respect to all samples. Specifically, it was shown that sufficiently useful force for clamping a silicon wafer or the like was obtained.

As is explained in the above, according to the present invention, it is possible to produce an electrostatic chuck in which the surface can be kept smooth after being exposed to plasma, so as to protect a material to be clamped such as a silicon wafer from being contaminated with particles, and which is excellent in clamping and releasing a material to be clamped and easy to manufacture by low-temperature firing.

Although there have been described what are the present embodiments of the invention, it will be understood that variations and modifications may be made thereto within the scope of the claims appended hereto.

What is claimed is:

1. An electrostatic chuck comprising a dielectric material in which alumina is 99.4 wt % or more, and titanium oxide is more than 0.2 wt % and equal to or less than 0.6 wt %, wherein the electrostatic chuck has a volume resistivity of $10^8$-$10^{11}$ Ωcm in room temperature, and wherein the titanium oxide segregates in boundaries of particles of the alumina.

2. The electrostatic chuck according to claim 1, wherein the electrostatic chuck has a bulk density of 3.97 g/cm³ or more.

3. The electrostatic chuck according to claim 1, wherein no aluminum titanate ($Al_2TiO_5$) exists within the alumina particles and in the boundaries of the alumina particles.

4. The electrostatic chuck according to claim 1, wherein the electrostatic chuck produces an effective clamping force at a temperature of 100° C. or less.

5. The electrostatic chuck according to claim 1, wherein the dielectric material has a substantially smooth surface with a plurality of protrusions thereon which are adapted to support a material to be clamped, in which a ratio of a total area of top surfaces of the protrusions and an area of the surface of the dielectric material is equal to or more than 0.001% and less than 0.5%, and a height of the protrusions is 5-15 μm.

6. The electrostatic chuck according to claim 2, wherein no aluminum titanate ($Al_2TiO_5$) exists within the alumina particles and in the boundaries of the alumina particles.

7. The electrostatic chuck according to claim 2, wherein the electrostatic chuck produces an effective clamping force at a temperature of 100° C. or less.

8. The electrostatic chuck according to claim 3, wherein the electrostatic chuck produces an effective clamping force at a temperature of 100° C. or less.

9. The electrostatic chuck according to claim 6, wherein the electrostatic chuck produces an effective clamping force at a temperature of 100° C. or less.

10. The electrostatic chuck according to claim 2, wherein the dielectric material has a substantially smooth surface with a plurality of protrusions thereon which are adapted to support a material to be clamped, in which a ratio of a total area of top surfaces of the protrusions and an area of the surface of the dielectric material is equal to or more than 0.001% and less than 0.5%, and a height of the protrusions is 5-15 μm.

11. The electrostatic chuck according to claim 3, wherein the dielectric material has a substantially smooth surface with a plurality of protrusions thereon which are adapted to support a material to be clamped, in which a ratio of a total area of top surfaces of the protrusions and an area of the surface of the dielectric material is equal to or more than 0.001% and less than 0.5%, and a height of the protrusions is 5-15 μm.

12. The electrostatic chuck according to claim 4, wherein the dielectric material has a substantially smooth surface with a plurality of protrusions thereon which are adapted to support a material to be clamped, in which a ratio of a total area of top surfaces of the protrusions and an area of the surface of the dielectric material is equal to or more than 0.001% and less than 0.5%, and a height of the protrusions is 5-15 μm.

13. The electrostatic chuck according to claim 1, wherein particles of the titanium oxide are continuously connected with each other in the electrostatic chuck.

14. The electrostatic chuck according to claim 2 wherein particles of the titanium oxide are continuously connected with each other in the electrostatic chuck.

15. The electrostatic chuck according to claim 1, wherein the titanium oxide forms a network in the electrostatic chuck.

16. The electrostatic chuck according to claim 2, wherein the titanium oxide forms a network in the electrostatic chuck.

17. The electrostatic chuck according to claim 1, wherein the titanium oxide in the electrostatic chuck has a non-stoichiometric composition.

18. The electrostatic chuck according to claim 2, wherein the titanium oxide in the electrostatic chuck has a non-stoichiometric composition.

* * * * *